(12) United States Patent
Lee

(10) Patent No.: US 8,618,846 B2
(45) Date of Patent: Dec. 31, 2013

(54) SOLID-STATE SWITCH DRIVING CIRCUIT FOR VEHICLE

(75) Inventor: Weon ho Lee, Suwon-si (KR)

(73) Assignee: Daesung Electric Co., Ltd., Ansan-Si (KR)

( * ) Notice: Subject to any disclaimer, the term of this patent is extended or adjusted under 35 U.S.C. 154(b) by 197 days.

(21) Appl. No.: 13/231,054

(22) Filed: Sep. 13, 2011

(65) Prior Publication Data

US 2013/0063187 A1    Mar. 14, 2013

(51) Int. Cl.
*H03B 1/00* (2006.01)

(52) U.S. Cl.
USPC ........................................... 327/109; 327/108

(58) Field of Classification Search
USPC ........................ 327/110, 112, 109, 108, 427
See application file for complete search history.

(56) References Cited

U.S. PATENT DOCUMENTS 8,395,422 B2 *   3/2013   Ogawa et al. ................. 327/109

\* cited by examiner

*Primary Examiner* — Hai L Nguyen
(74) *Attorney, Agent, or Firm* — Schmeiser, Olsen & Watts LLP

(57) ABSTRACT

Disclosed herein is a solidstate switch driving circuit for a vehicle. The solidstate switch driving circuit includes an oscillation circuit, a constant voltage circuit, a first Field Effect Transistor (FET), a second FET, a third FET configured, a first time constant circuit, a first time constant circuit, a reverse voltage protection diode, a solidstate power switch, and a second time constant circuit. The first time constant circuit is connected to the drain of the second FET and the drain of the third FET. The reverse voltage protection diode has an N pole and a P pole. The solidstate power switch selectively turns on and off power applied to the load. The second time constant circuit has one side connected to the first time constant circuit and the reverse voltage protection diode, and another side connected to a gate of the solidstate power switch.

7 Claims, 2 Drawing Sheets

SOLID-STATE SWITCH DRIVING CIRCUIT FOR VEHICLE

BACKGROUND OF THE INVENTION

1. Field of the Invention

The present invention relates generally to a solid-state switch driving circuit for a vehicle and, more particularly, to a solid-state switch driving circuit for a vehicle, which selectively allows and interrupts the application of voltage from a vehicle battery to a load (i.e., an electric device).

2. Description of the Related Art

A conventional power switch for a vehicle employs a power relay. The anode of a battery (B+, 12 V) is connected to the top of the coil of the power relay, and a ground GND is connected to the bottom of the coil. Accordingly, B+ voltage should be applied to the top of the coil in order to drive the power relay.

When the B+ battery power is applied to the coil, current flows through the coil, the relay turns on the switch, and therefore the battery power is applied to a load.

In this case, problems arise in that the contact of the relay may be damaged by an excessive inrush current when the relay is turned on and peripheral circuits may be damaged because surge voltage is applied to the peripheral circuits when the relay is turned off.

The peripheral circuits may not operate stably because of the introduction of high surge voltage generated at this time. Moreover, another problem arises in that a short circuit may occur between the coil of the power relay and the ground because voltage is always applied to the coil.

SUMMARY OF THE INVENTION

Accordingly, the present invention has been made keeping in mind the above problems occurring in the prior art, and an object of the present invention is to provide a solid-state switch driving circuit for a vehicle which uses and controls the solid-state switch for preventing an excessive inrush current or a surge voltage from being generated.

In order to achieve the above object, the present invention provides a solid-state switch driving circuit for a vehicle, including an oscillation circuit configured to generate square waves having a specific width; a constant voltage circuit configured to supply constant voltage to the oscillation circuit; a first Field Effect Transistor (FET) (129) connected to an output of the oscillation circuit and configured to have a drain connected to a battery via a resistor (123) and a source grounded and configured to output the square waves in response to output of the oscillation circuit; a second FET (113) configured to have a gate connected to output of the first FET (129) and to be selectively turned on and off by the first FET (129); a third FET (115) configured to have a gate connected to the drain of the first FET (129) and a drain connected to a drain of the second FET (113) and to output an output opposite to an output of the second FET (113) and to be selectively turned on and off by the first FET (129); a first time constant circuit connected to the drain of the second FET (113) and the drain of the third FET (115), and configured to have one side connected to the battery via a diode; a reverse voltage protection diode (101) configured to have an N pole connected in series to the first time constant circuit and a P pole connected to the battery; a solid-state power switch (117) configured to have a drain connected to the battery and a source connected to a load, and configured to selectively turn on and off power applied to the load; and a second time constant circuit configured to have one side connected to the first time constant circuit and the reverse voltage protection diode (101), another side connected to a gate of the solid-state power switch (117), and yet another side grounded.

Two diodes (137 and 139) having different polarities may be disposed in parallel between an input terminal and an output terminal of the oscillation circuit, resistors (141 and 143) may be connected in series to the respective diodes (137 and 139), and the input terminal of the oscillation circuit may include an inverter gate (131) grounded via a condenser (145).

The power of the battery may be applied to the N pole of the constant voltage circuit via a resistor (125), the constant voltage circuit may be connected in parallel to a condenser (135), and the constant voltage circuit may include a Zener diode (133) for generating constant DC constant voltage.

The first time constant circuit may include a first time constant condenser (105) and a first time constant resistor (107) which are coupled in series.

The second time constant circuit may include a second time constant resistor (103) and a second time constant condenser (109) which are coupled in series.

The solid-state power switch (117) may include a switch (SW1) for forming a discharge circuit between the gate and the source of the solid-state power switch (117), and, when the switch (SW1) is closed, the discharge circuit may be formed.

The N pole of the reverse voltage protection diode (101) may be connected to a P pole of the first time constant circuit, and the N pole of the reverse voltage protection diode (101) may further include a discharge prevention diode (104) connected to the one side of the second time constant circuit.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Embodiments of a solid-state switch driving circuit for a vehicle according to the present invention will be described in detail with reference to the accompanying drawings. The following embodiments are intended to illustrate the present invention and not to limit the scope of the present invention.

Figure 1:
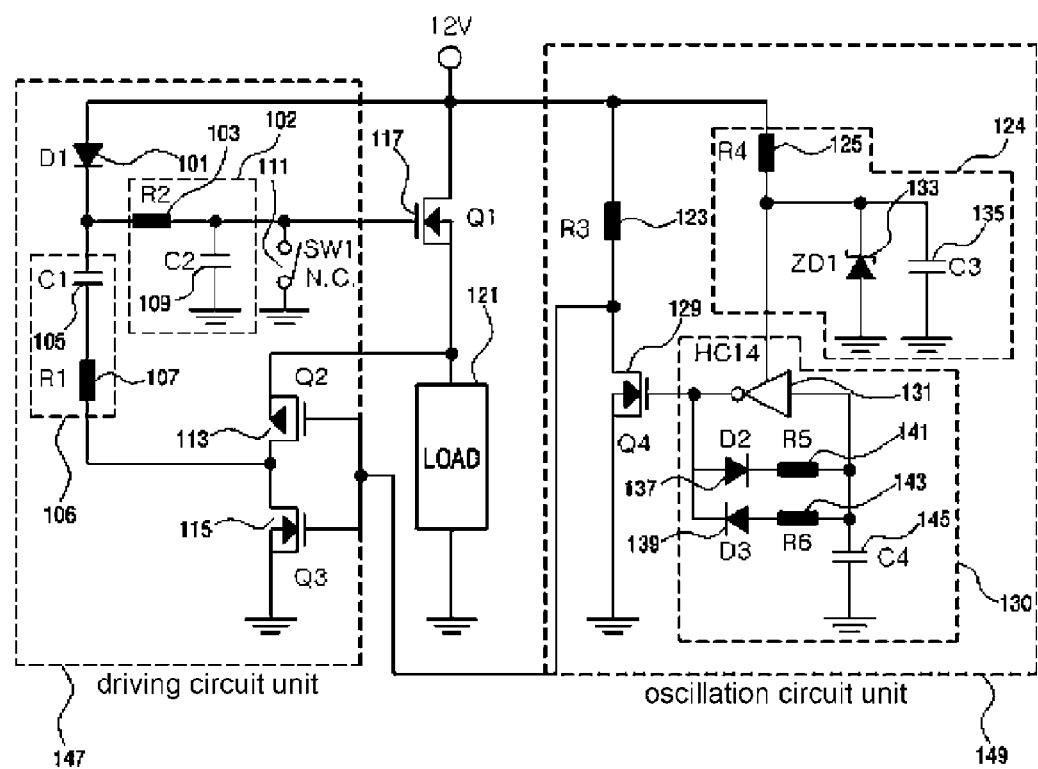
FIG. 1 is a circuit diagram of a solid-state switch driving circuit for a vehicle according to an embodiment of the present invention.

Referring to FIG. 1, a solid-state switch driving circuit for a vehicle according to an embodiment of the present invention chiefly includes a driving circuit unit 147 for driving a solid-state power switch (Field Effect Transistor (FET)) Q1 117, and an oscillation circuit unit 149 for supplying oscillation signals to the driving circuit unit 147.

When power 12 V is applied to the oscillation circuit unit 149 so as to drive the solid-state power switch (FET) Q1 117, a power of 12 V applied to a constant voltage circuit 124 is converted into a constant voltage of 5.1 V and then supplied to an oscillation circuit 130.

A capacitor C3 135 stabilizes a constant voltage of 5.1 V using the Zener diode ZD1 133 of the oscillation circuit 130.

A resistor R4 125 protects the Zener diode ZD1 133 by limiting the current that is applied to the Zener diode ZD1 133, to some extent.

The inverter HC14 131 of the oscillation circuit 130 to which the power has been applied generates pulse waveforms using a differential circuit, including a capacitor C4 145 and a resistor R6 143, and an integral circuit, including a resistor R5 141 and a capacitor C4 145. The generated pulse waveforms are applied to the gate of a first FET Q4 129.

The inverted waveforms of the pulse waveforms applied to the gate of the first FET Q4 129 are applied to the gates of a second FET Q2 113 and a third FET Q3 115. The applied waveforms are inverted square waves, which drive the solid-state power switch (FET) Q1 117 using charge into and discharge from the capacitor C1 105 via the resistor R1 107 of a first time constant circuit 106.

Here, the first switch SW1 111 is used to form the FET Ciss discharge circuit of the solid-state power switch (FET) Q1 117. The resistor R2 103 and capacitor C2 109 of a second time constant circuit 102 form an integral circuit for driving the gate of the solid-state power switch (FET) Q1 117.

When a first switch SW1 111 is turned off, the charge to and discharge from the drains of the second FET Q2 113 and the third FET Q3 115 attributable to the High and Low signals of the pulse waveforms maintain voltage between the gate and the source of the solid-state power switch (FET) Q1 117 via the integral circuit R2 and C2. When the solid-state power switch (FET) Q1 117 is turned on, the power is applied to a load LOAD 121. When the first switch SW1 111 is turned on, the gate of the solid-state power switch (FET) Q1 117 is grounded, and a discharge circuit is formed between the gate and the source via the ground circuit and the load 121. Accordingly, the solid-state power switch (FET) Q1 117 is turned off, and the supply of the power to the load LOAD 121 is interrupted.

When the first switch 111 SW1 is opened, the solid-state power switch (FET) Q1 117 is turned on with some delay time. Accordingly, the power is applied to the load 121 without intervention of an excessive inrush current or a surge voltage occurring in the load LOAD 121.

Meanwhile, the first switch SW1 111 is controlled using an external signal (not shown). When the first switch SW1 111 is in an open state, the solid-state power switch (FET) Q1 117 is turned on, and thus the power is applied to the load LOAD 121 via the drain and source of the solid-state power switch (FET) Q1 117. When the first switch SW1 111 is in a closed state, a discharge circuit is formed between the gate and source of the solid-state power switch (FET) Q1 117, so that charges charged into the FET Ciss discharge circuit of the solid-state power switch (FET) Q1 117 are discharged. After the charges charged into the FET Ciss discharge circuit of the solid-state power switch (FET) Q1 117 are discharged, the solid-state power switch (FET) Q1 117 enters into an OFF state. A1

Figure 2:
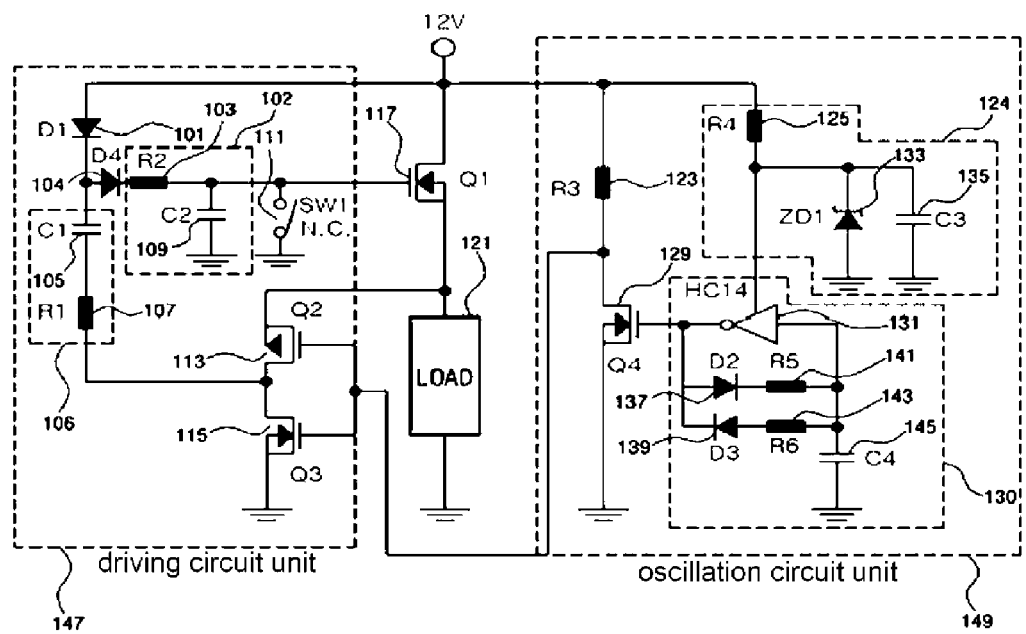
FIG. 2 is a circuit diagram of a modification example of the solid-state switch driving circuit of FIG. 1.

FIG. 2 is a circuit diagram of a modification example of the solid-state switch driving circuit of FIG. 1. The solid-state switch driving circuit for a vehicle further includes a discharge prevention diode D4 104. The N pole of the discharge prevention diode D4 104 is connected to the N pole of a reverse voltage protection diode 101, and the P pole of the discharge prevention diode D4 104 is connected to the first time constant circuit. The N pole of the discharge prevention diode D4 104 is connected to one side of the second time constant circuit.

The following description will be given with a focus on the function of the above-described, added discharge prevention diode D4 104.

Square waves obtained by the oscillation circuit 130 sequentially drive the second FET Q2 113 and the third FET Q3 115 via the first FET Q4 129. The first time constant condenser 105, C1 is successively charged and discharged by the driving. Accordingly, gate voltage higher than power supply voltage for driving the solid-state power switch (FET) Q1 117 is formed in the integral circuit including the second time constant resistor R2 103 and the second time constant condenser C2 109. A2

In this case, when the discharge prevention diode D4 104 is added, the operation of the first time constant condenser C1 105 being charged due to the conduction of the second FET Q2 113 is the same in the integral circuit, including the second time constant resistor R2 103 and the second time constant condenser C2 109. However, when the third FET Q3 115 is conducted, the voltage of the integral circuit, including the second time constant resistor R2 103 and the second time constant condenser C2 109, is prevented from being discharged through the first time constant condenser C1 105. Accordingly, the voltage of the integral circuit, including the second time constant resistor R2 103 and the second time constant condenser C2 109, has a more rapid voltage rising speed than that prior to the addition of the discharge prevention diode D4 104, and the same operation is performed even when the integer value of the second time constant resistor R2 103 and the second time constant condenser C2 109 is small.

As described above, according to the solid-state switch driving circuit for a vehicle according to the present invention, when power is applied in a vehicle, a surge voltage and an inrush current are not generated thanks to the coil of the relay. Accordingly, advantages arise in that damage to a circuit and the malfunction of a circuit do not occur and the size of a product can be reduced compared to a coil-type relay.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A solid-state switch driving circuit for a vehicle, comprising:
   an oscillation circuit configured to generate square waves having a specific width;
   a constant voltage circuit configured to supply constant voltage to the oscillation circuit;
   a first Field Effect Transistor (FET) (129) connected to an output of the oscillation circuit, and configured to have a drain connected to a battery via a resistor (123) and a source grounded and configured to output the square waves in response to output of the oscillation circuit;
   a second FET (113) configured to have a gate connected to output of the first FET (129) and to be selectively turned on and off by the first FET (129);
   a third FET (115) configured to have a gate connected to the drain of the first FET (129) and a drain connected to a drain of the second FET (113) and to output an output opposite to an output of the second FET (113) and to be selectively turned on and off by the first FET (129);
   a first time constant circuit connected to the drain of the second FET (113) and the drain of the third FET (115), and configured to have one side connected to the battery via a reverse voltage protection diode (101);
   wherein the reverse voltage protection diode (101) is configured to have an N pole connected in series to the first time constant circuit and a P pole connected to the battery;

a solid-state power switch (117) configured to have a drain connected to the battery and a source connected to a load, and configured to selectively turn on and off power applied to the load; and a second time constant circuit configured to have one side connected to the first time constant circuit and the reverse voltage protection diode (101), another side connected to a gate of the solid-state power switch (117), and yet another side grounded.

2. The solid-state switch driving circuit as set forth in claim 1, wherein:

two diodes (137 and 139) having different polarities are disposed in parallel between an input terminal and an output terminal of the oscillation circuit;

resistors (141 and 143) are connected in series to the respective diodes (137 and 139); and the input terminal of the oscillation circuit includes an inverter gate (131) grounded via a condenser (145).

3. The solid-state switch driving circuit as set forth in claim 1, wherein:

the power of the battery is applied to the N pole of the constant voltage circuit via a resistor (125);

the constant voltage circuit is connected in parallel to a condenser (135); and the constant voltage circuit comprises a Zener diode (133) for generating constant DC constant voltage.

4. The solid-state switch driving circuit as set forth in claim 1, wherein the first time constant circuit comprises a first time constant condenser (105) and a first time constant resistor (107) which are coupled in series.

5. The solid-state switch driving circuit as set forth in claim 1, wherein the second time constant circuit comprises a second time constant resistor (103) and a second time constant condenser (109) which are coupled in series.

6. The solid-state switch driving circuit as set forth in claim 1, wherein:

the solid-state power switch (117) comprises a switch (SW1) for forming a discharge circuit between the gate and the source of the solid-state power switch (117); and when the switch (SW1) is closed, the discharge circuit is formed.

7. The solid-state switch driving circuit as set forth in claim 1, wherein:

the N pole of the reverse voltage protection diode (101) is connected to a P pole of the first time constant circuit; and the N pole of the reverse voltage protection diode (101) further comprises a discharge prevention diode (104) connected to the one side of the second time constant circuit.

\* \* \* \* \*